(12) United States Patent
Van Bommel

(10) Patent No.: US 12,281,760 B2
(45) Date of Patent: Apr. 22, 2025

(54) LED FILAMENT WITH ELEVATED PHOSPHOR LAYER FOR FLAME APPEARANCE

(71) Applicant: SIGNIFY HOLDING B.V., Eindhoven (NL)

(72) Inventor: Ties Van Bommel, Horst (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 18/572,239

(22) PCT Filed: Jun. 20, 2022

(86) PCT No.: PCT/EP2022/066704
§ 371 (c)(1),
(2) Date: Dec. 20, 2023

(87) PCT Pub. No.: WO2022/268700
PCT Pub. Date: Dec. 29, 2022

(65) Prior Publication Data
US 2024/0369196 A1   Nov. 7, 2024

(30) Foreign Application Priority Data
Jun. 22, 2021 (EP) .................................. 21180916

(51) Int. Cl.
*F21K 9/64* (2016.01)
*F21K 9/232* (2016.01)
(Continued)

(52) U.S. Cl.
CPC ................ *F21K 9/64* (2016.08); *F21K 9/232* (2016.08); *F21K 9/238* (2016.08);
(Continued)

(58) Field of Classification Search
CPC .......... C09K 11/77348; C09K 11/7774; C09K 11/616; C09K 11/0883; F21Y 2103/10;
(Continued)

(56) References Cited

U.S. PATENT DOCUMENTS

2011/0001148 A1    1/2011  Sun et al.
2014/0361318 A1   12/2014  Miki et al.
(Continued)

FOREIGN PATENT DOCUMENTS

| CN | 108155280 A | 6/2018 |
| WO | 2012120408 A1 | 9/2012 |
| WO | 2021094257 A1 | 5/2021 |

*Primary Examiner* — Anne M Hines
*Assistant Examiner* — Jose M Diaz

(57) ABSTRACT

A LED filament (2,20) configured to provide LED filament light. The LED filament comprising an elongated carrier (7) extending in a lengthwise direction, said elongated carrier comprising a first major surface (7a). The LED filament further comprises a plurality of LEDs (8) arranged on said first major surface and configured to emit LED light, a first layer (9) free from a luminescent material encapsulating or covering said plurality of LEDs and at least partly encapsulating or covering said first major surface, said first elongated translucent layer having a width, W1, transverse to said lengthwise direction, and a second layer (10) comprising a luminescent material configured to partly convert said LED light, the second layer is arranged on an outer surface (9a) of said first layer, such that the second layer is contained within the width, $W_1$, of the first layer.

12 Claims, 2 Drawing Sheets

(51) Int. Cl.
  *F21K 9/238* (2016.01)
  *F21Y 103/10* (2016.01)
  *F21Y 113/17* (2016.01)
  *F21Y 115/10* (2016.01)

(52) U.S. Cl.
  CPC ....... *F21Y 2103/10* (2016.08); *F21Y 2113/17* (2016.08); *F21Y 2115/10* (2016.08)

(58) Field of Classification Search
  CPC .............. F21Y 2107/00; F21Y 2113/17; F21Y 2115/10; H01L 33/508; H01L 33/505; H01L 33/504; H01L 33/507; H01L 33/54; H01L 2933/0091; H01L 25/0753; F21V 19/001; F21K 9/64; F21K 9/232; F21K 9/238
  See application file for complete search history.

(56) References Cited

U.S. PATENT DOCUMENTS

| | | | |
|---|---|---|---|
| 2015/0069442 A1* | 3/2015 | Liu | F21K 9/232 257/98 |
| 2017/0012182 A1 | 1/2017 | Cao et al. | |
| 2019/0157250 A1 | 5/2019 | Windisch et al. | |
| 2020/0303355 A1 | 9/2020 | Wang et al. | |

* cited by examiner

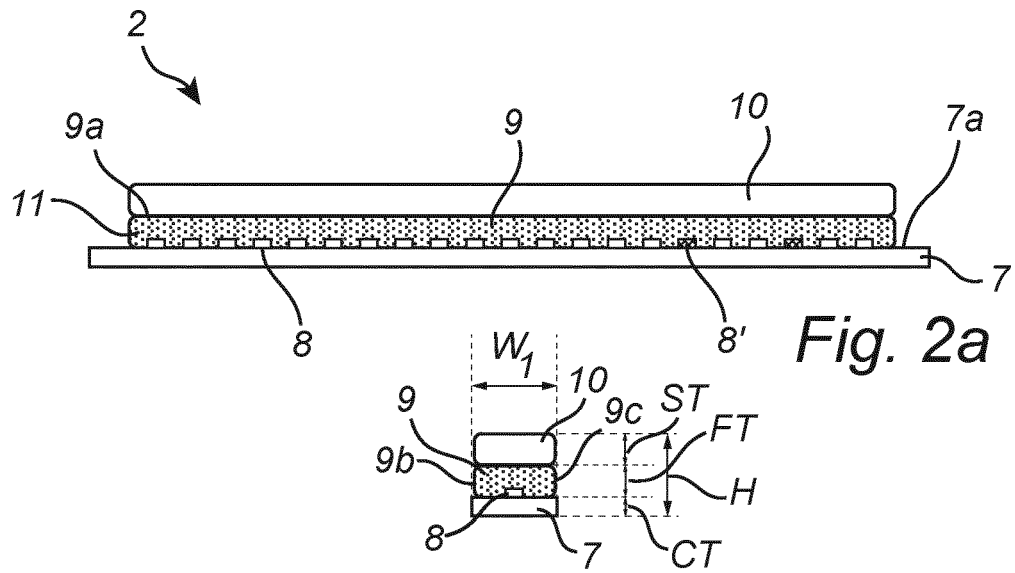
Fig. 2a
Fig. 2b
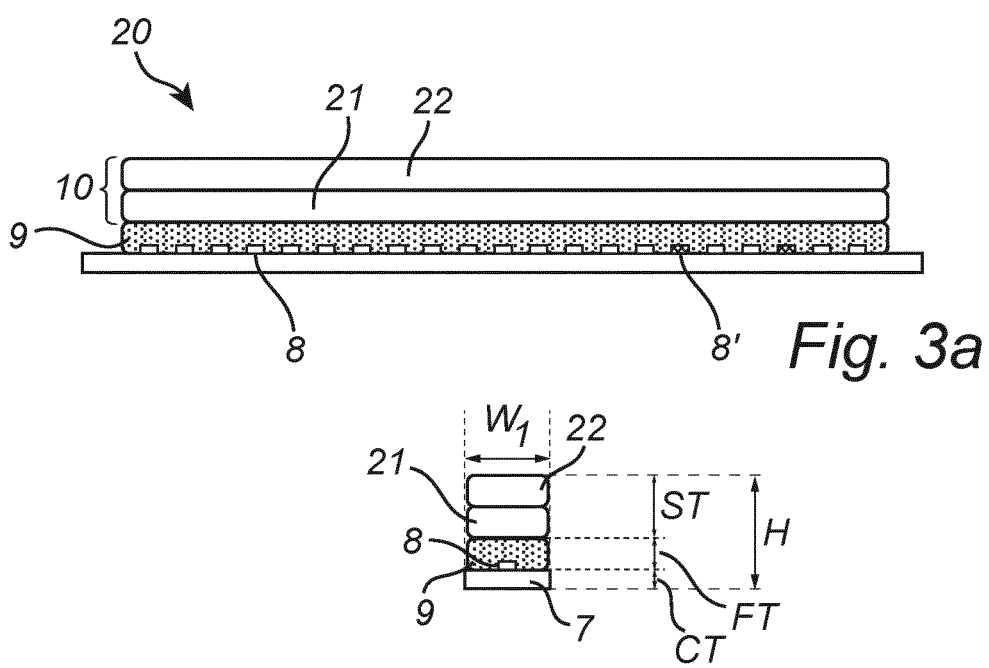
Fig. 3a
Fig. 3b

LED FILAMENT WITH ELEVATED PHOSPHOR LAYER FOR FLAME APPEARANCE

CROSS-REFERENCE TO PRIOR APPLICATIONS

This application is the U.S. National Phase application under 35 U.S.C. § 371 of International Application No. PCT/EP2022/066704, filed on Jun. 20, 2022, which claims the benefit of European patent application Ser. No. 21/180, 916.5, filed on Jun. 22, 2021. These applications are hereby incorporated by reference herein.

FIELD OF THE INVENTION

This invention relates to LED filament light emitting devices, more specifically to a LED filament.

BACKGROUND OF THE INVENTION

Incandescent lamps are rapidly being replaced by LED based lighting solutions. It is nevertheless appreciated and desired by users to have retrofit lamps which have the look of an incandescent bulb. For this purpose, one can simply make use of the infrastructure for producing incandescent lamps based on glass and replace the filament with LEDs emitting white light. One of the concepts is based on LED filaments placed in such a bulb, as discussed in US 2020/0303355 A1 where the LED filament form part of an energy efficient bulb. The appearances of these lamps are highly appreciated as they look highly decorative. Therefore, it is desirable to introduce additional visual effects to make them more decorative, further improve their resemblance to an incandescent lamp and/or having the LED filaments emit light within more than one wavelength range. To further enhance the decorative effect, it may be desired to introduce a LED filament emitting different colors. To provide for this, US 2020/0303355 A1 disclose applying a single layer comprising a mixture of broad-band green and red photoluminescence materials onto a LED-filament with blue-LEDs, and that the particles of a light scattering material can be combined with the phosphor material to reduce the quantity of phosphor required to generate a given emission product color. However, this does not provide for a LED filament where different colors are separated and displayed at the same time.

US 2011/001148 discloses a thin, flat solid state light source device and methods for manufacturing is described. LED chips and their circuit boards are mounted on a thermal conductive substrate. The LED chips are surrounded with a flat layer of reflecting material which may embed the circuit boards. The LED chips and the reflecting layer is then topped with a layer of diffusion material and a layer of cover material.

US2017012182 is related to a white light LED lamp and a filament. The white light LED filament comprises light emitting units and a strip-shaped fluorescent wafer(s) at least positioned at one side of the light emitting units, wherein the light emitting units are blue-emitting chips connected by a metal wire or an electric conductive circuit, and wherein electrodes are arranged at the end(s) of the fluorescent wafer. Without any lens, the filament of the present invention has a simple structure. A white light LED lamp using the filament realizes a 360 degrees stereo-luminescence.

SUMMARY OF THE INVENTION

It is an object of the present invention to overcome this problem, and to provide an LED filament with an elevated luminescence.

The present invention relates to an LED filament in accordance with the independent claim 1. Preferred embodiments are defined by the dependent claims.

According to a first aspect of the invention, this and other objects are achieved through a light emitting diode, LED, filament configured to provide LED filament light and comprising an elongated carrier extending in a lengthwise direction of said LED filament, said elongated carrier comprising a first major surface, a plurality of LEDs arranged on said first major surface of said elongated carrier, and configured to emit LED light, a first elongated translucent layer encapsulating or covering said plurality of LEDs and at least partly encapsulating or covering said first major surface of said elongated carrier, said first elongated translucent layer is substantially free from a luminescent material, said first elongated translucent layer having a width, $W_1$, transverse to said lengthwise direction and a second elongated translucent layer comprising a luminescent material configured to partly convert said LED light into converted light, the second elongated translucent layer is (only) arranged on an outer surface of said first elongated translucent layer, such that the second elongated translucent layer is contained within the width, $W_1$, of the first elongated translucent layer and wherein the LED filament light comprises part of the LED light and the converted light.

Hence, the present invention is based on the idea that the second elongated translucent layer is elevated from the carrier, allowing LED light to escape the LED filament from the sides of the first elongated translucent layer which is not covered by the second elongated translucent layer. Accordingly, this provides the LED light to be visible through the first elongated translucent layer. When the LED filament is in use this provides the color of the LED light (its emitted wavelengths) from the LEDs to be seen in or through the sides of the first layer while providing a luminescent effect in the second layer. Hence, a color gradient of the LED filament light may be achieved from the major surface, where the color gradient depends on the choice of LEDs and type of material in the second elongated translucent layer. The plurality of LEDs may comprise blue LEDs emitting blue LED light and/or cool white LEDs emitting cool white light having a color temperature of at least 6000K. Optionally, all LEDs arranged on the first major surface are blue LEDs and/or cool white LEDs emitting cool white light having a color temperature of at least 6000K. Alternatively, the plurality of LEDs may further comprise LEDs of a different color (LEDs emitting different wavelengths), e.g. red LEDs or warm white LEDs, in order to adapt the color temperature of the LED filament. The number of LEDs having a different color may be different depending on application. It may be desired to have about 5%-10% of the LEDs in the plurality of LEDs in a different color. By the first layer elongated translucent layer being substantially free from luminescent material it means there may be no luminescent material in the first layer. Alternatively, a very low concentration of luminescent material may be present in the first layer with respect to the concentration of luminescent material in the second elongated translucent layer. Hence, it should be understood that there may be a low amount of luminescent material present in the first layer, such as traces of luminescent material, without diverging from the concept of this invention. The concentration of luminescent material in the first layer may be defined at being at least a factor 10, preferably at least a factor 20, more preferably at least a factor 50 lower than the concentration of luminescent material in the second elongated translucent layer. It should further be understood that the LED filament light is the light exiting the LED filament, wherein the LED filament light comprises the LED light, being unconverted, and the converted light from the second layer.

The different colored LEDs may be individually controllable, such that a color temperature of the LED light is dynamically adjustable.

It may be advantageous to provide a flexible LED filament in order to form for example a helix (spiral) shape of the LED filament. Accordingly, the carrier and the first and second elongated translucent layers may be flexible.

The first elongated translucent layer may have a thickness of 2-10 mm, preferably 2-9 mm, more preferably 4-8 mm most preferably 5-7 mm in order for a predetermined amount of LED filament light to exit the LED filament sideways. Having a thinner first layer may not provide enough LED light to escape from the sides of the first layer. When the first layer is thicker there may be too much LED light escaping the first layer, negatively affecting the amount of LED light entering the second layer. Further, when the first layer is too thick (thickness above the desired range) an undesired color gradient may be achieved. With the provided thickness ranges of the first layer, 5-40% of the LED light may escape the LED filament at the first elongated translucent layer. The light which escapes the LED filament at sides of the first elongated translucent layer which is not covered by the second elongated translucent layer may be blue light, blueish light or cool white having a color temperature of at least 4000K. Hence, it should be understood that at least LED light escapes the LED filament from the first elongated translucent layer, which would result in the light escaping the first layer to be at least 6000K. However, as LED light may be mixed with converted light (from the second elongated layer) before escaping the LED filament from the first layer, such that the light escaping the first layer may have a shifted color temperature compared to the LED light due to the converted light.

Generally, "thickness" as discussed in this text is measured along the normal of the first major surface.

The first elongated translucent layer may comprise light scattering particles for providing sufficient light outcoupling and homogenization. The light scattering particles may cause light from the LEDs to scatter sideways such that an increased portion of the LED filament light will scatter sideways. The amount of LED light escaping the first layer may further depend on the amount and type of scattering particles within the first layer. Accordingly, the scattering particles may provide increased amount of LED filament light escaping the LED filament sideways and thus providing less amount of light from the LEDs entering the second elongated translucent layer. The light scattering particles may typically be BaSO4, Al2O3 and/or TiO2 particles. The scattering particles in the first layer may scatter 3%-30% of the LED light back towards the carrier. A partially reflective layer may be arranged between the first elongated translucent layer and the second elongated translucent layer. This may increase the amount of LED light escaping the first layer by the LED light being partially reflected back into the first layer. The first major surface may be reflective in order to improve the light efficiency of the device and to reflect any light impinging on the first major surface, such as light being scattered back towards the carrier in the first elongated translucent layer.

The luminescent material in the second elongated translucent layer may comprise phosphor, such as a yellow phosphor converting LED light into yellow phosphor light. Optionally, the luminescent material may also comprise a red phosphor converting the LED light and/or the yellow phosphor light into red phosphor light. The phosphor facilitates the luminescent effect and having a yellow phosphor, and optionally a red phosphor may provide a color resembling a flame, i.e. a flamelike appearance may be achieved by the phosphor in the second layer. Especially, when the blue color from the LED is visual adjacent to the carrier the flamelike appearance may further be improved. The light which escapes the LED filament from the second elongated translucent layer may be warm white having a color temperature of less than 2500K.

According to one embodiment the second elongated translucent layer comprises at least two sublayers, a first sublayer comprising the first luminescent material configured to partly convert said LED light into converted light and a second sublayer comprising a second luminescent material configured to partly convert said LED light and/or said converted light into further converted light, the second sublayer is arranged on an outer surface of said first sublayer, wherein the further converted light is different from the converted light. The further converted light may preferably have a higher wavelength than the converted light. This may provide additional colors in the achieved color gradient. For example, the first sublayer may comprise a red phosphor and the second sublayer may comprise a yellow phosphor, such that the yellow phosphor light is emitted from the first sublayer and the red phosphor light is emitted from the second sublayer to further enhance the flamelike appearance.

The LED filament may further have a height, H, defined by the carrier thickness and the thickness of the first and second elongated translucent layers and wherein the ratio $H/W_1$ is at least 1.5. This may further improve the visual effect of the LED filament when in use.

According to a second aspect, a lamp comprising a LED filament according to anyone of the preceding embodiments is provided. The lamp comprises a translucent envelope enveloping the LED filament and a connector for electrically and mechanically connecting the lamp to a socket (of a luminaire). This may be advantageous as the LED filament lamp may be formed to resemble an incandescent lamp. Further, this may provide the lamp to be retrofitted into a standard type socket providing the user with an energy efficient light bulb. The LED filament may be arranged in a helix (spiral) shape. The lamp may comprise a controller for controlling the plurality of LEDs to vary the luminous flux of the LED filament. Especially in a case where the LED filament includes individually controllable groups of different colored LEDs, such a controller may be advantageous.

It is noted that the invention relates to all possible combinations of features recited in the claims.

BRIEF DESCRIPTION OF THE DRAWINGS

This and other aspects of the present invention will now be described in more detail, with reference to the appended drawings showing embodiment(s) of the invention.

FIGS. 2a and 2b illustrate different sideviews of a light emitting diode, LED, filament configured to provide LED filament light according to at least one embodiment.

FIGS. 3a-3b illustrate different sideviews of a light emitting diode, LED, filament configured to provide LED filament light according to at least one embodiment.

As illustrated in the figures, the sizes of layers and regions are exaggerated for illustrative purposes and, thus, are provided to illustrate the general structures of embodiments of the present invention. Like reference numerals refer to like elements throughout.

DETAILED DESCRIPTION

Figure 1:
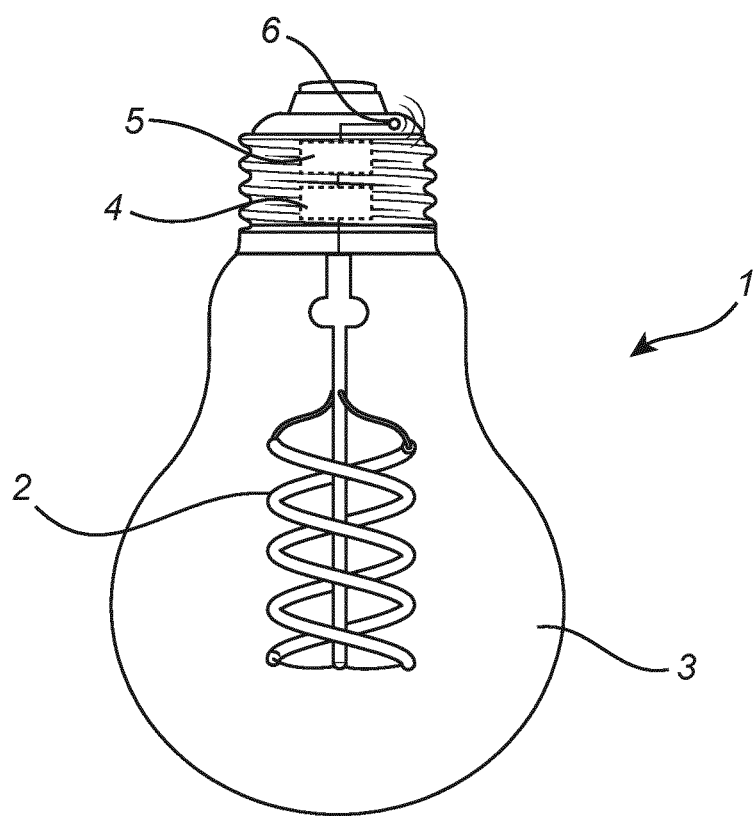
FIG. 1 illustrates a sideview of a light emitting diode, LED, filament lamp comprising a LED filament.

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

FIG. 1 illustrates a light emitting diode, LED, filament lamp 1 comprising a LED filament 2. The LED filament lamp 1 comprises an envelope enveloping said LED filament 2. The LED filament 2 (explained in more detail below) is here connected to a driver 4 for regulating the power to the LED filament 2. The LED filament 2 is further connected to a controller 5 for controlling said LED filament 2. The controller 2 may communicate with a remote controller (not shown) via the antenna 6. The LED filament lamp 2 may be retrofitted into a standard type socket, e.g. a socket of type E26, E12, E14 and/or E27. Hence, the LED filament lamp 2 may comprise a threaded electrical connector 12, such as a threaded Edison connector according to the above standards, in order to connect the lamp 1 to an electric socket (not shown). The LED filament lamp may comprise more than one LED filaments 2. The LED filament 2 is here arranged in a helix shape, however it should be understood that the LED filament 2 may be of any shape such as a straight configuration or any curved configuration, such as the discussed helix (spiral) shape.

The LED filament 2 is providing LED filament light and comprises a plurality of light emitting diodes (LEDs) arranged in a linear array, wherein each LED is configured to emit LED light. Preferably, the LED filament has a length L and a width W, wherein L>5W. The LED filament may be arranged in a straight configuration or in a non-straight configuration such as for example a curved configuration, a 2D/3D spiral or a helix. Preferably, the LEDs are arranged on an elongated carrier like for instance a substrate, that may be rigid (made from e.g. a polymer, glass, quartz, metal or sapphire) or flexible (e.g. made of a polymer or metal e.g. a film or foil).

In case the carrier comprises a first major surface and an opposite second major surface, the LEDs are arranged on at least one of these surfaces. The carrier may be reflective or light transmissive, such as translucent and preferably transparent.

The LED filament may comprise an encapsulant at least partly covering at least part of the plurality of LEDs. The encapsulant may also at least partly cover at least one of the first major or second major surface. The encapsulant may be a polymer material which may be flexible such as for example a silicone. Further, the LEDs may be arranged for emitting LED light e.g. of different colors or spectrums. The encapsulant may comprise a luminescent material that is configured to at least partly convert LED light into converted light, such that LED filament light, comprising the LED light and the converted light, is emitted from the LED filament. The luminescent material may be a phosphor such as an inorganic phosphor and/or quantum dots or rods.

The LED filament may comprise multiple sub-filaments.

Now turning to FIG. 2a, illustrating a sideview of the LED filament 2. The LED filament 2 comprises an elongated carrier 7. The carrier 7 is extending in a lengthwise direction of said LED filament (along the LED filament's length, L) and comprises a major surface 7a on which a plurality of diodes 8 are arranged. An encapsulant in the form of a first elongated translucent layer 9 is deposited onto the carrier 7 such that the diodes 8 are covered by the first elongated translucent layer 9. Hence, at least part of the major surface 7a of the carrier 7 is also covered by the first layer 9. A second elongated translucent layer 10 is arranged on an outer surface 9a of the first layer 9. The outer surface 9a is arranged substantially parallel to the first major surface 7a of the carrier 7 and facing away from the carrier 7. In other words, the first elongated translucent layer 9 may comprise a top surface 9a and two major side surfaces 9b,9c (see FIG. 2b), wherein the two major side surfaces 9b,9c are not covered by the second elongated translucent layer 10. In FIG. 2b the two major side surfaces 9b,9c are both illustrated to be transverse to the top surface 9a. Accordingly, at least part of the LED light emitted from the diodes 9 may escape the LED filament through the sides of the first layer 9 (e.g. through the two major side surfaces 9b,9c) without being converted. The amount of LED light, which is part of the LED filament light, escaping the LED filament through the first layer 9 depend on the thickness of the first layer 9. The thickness of the first layer may be 2-10 mm, preferably 2-9 mm, more preferably 4-8 mm most preferably 5-7 mm. In other words, the second elongated translucent layer 10 is spaced from the elongated carrier 7 by the first elongated translucent layer 9 by a spacing which may be in the range 2-10 mm, preferably 2-9 mm, more preferably 4-8 mm most preferably 5-7 mm. About 5-40% of the LED light may escape the LED filament at the first elongated translucent layer 9 when having a thickness of the first layer 9 according to the above.

The first layer 9 is substantially non-luminescent, i.e. it is substantially free from luminescent material such that absorption of the LED light is minimized, and such that the LED light is not converted into converted light. Hence, the color of the light emitted by the diodes 9 appears substantially unchanged when the LED light (being substantially unconverted light) escapes the first layer 9 at the sides of the first layer 9. The second layer 10 comprises a luminescent material, such as phosphor, configured to at least partly convert the LED light into converted light. The converted light may be shifted in wavelength with respect to the LED light (i.e. providing light of a different color than the LED light) and the wavelengths of the converted light will depend on the type of material in the second layer 10. In other words, the luminescent material in the second layer may be configured to convert the LED light into converted light with a different wavelength range than the LED light emitted from the LEDs 8. A major portion of the converted light may exit the LED filament from the second elongated translucent layer. A major portion of the LED light may exit the LED filament from the first elongated translucent layer (at sides which are not covered by the second elongated translucent layer). The LED filament light exiting the second elongated translucent layer may have a ratio of LED light to converted light which is lower than the LED filament light exiting the LED filament from the first elongated translucent layer (which is not covered by the second elongated translucent layer). Further, the light which escapes the LED filament at sides of the first elongated translucent layer which are not covered by the second elongated translucent layer is blue light, blueish light or cool white having a color temperature of at least 4000K.

Please note that in this text the terms "carrier" and "elongated carrier" may be used interchangeably, and unless stated otherwise, are meant to imply the same meaning. The same applies for "first layer" and "first elongated translucent layer" and also for "second layer" and "second elongated translucent layer".

The first elongated translucent layer 9 has a width, $W_1$, transverse to the lengthwise direction. The second layer 10 is arranged on the outer surface 9a such that the second layer 10 is contained within the width, $W_1$, of the first layer 9. In other words, the second layer 10 will not cover sides of the first layer 9 transverse to the outer surface 9a, nor will it cover the carrier 7. Accordingly, light emitted from the plurality of LEDs 8 will be visible at the sides of the first layer 9 adjacent to the major surface 7a. This provides a gradient of colors in a direction away from, and perpendicular, to the major surface 7a. The luminescent material may comprise phosphor, and the type of phosphor may be adapted to a desired application in order to provide colors of choice. Preferably the plurality of LEDs 8 are blue LEDs and/or cool white LEDs emitting cool white light having a color temperature of at least 6000K. The luminescent material in the second layer 10 may further comprise a yellow phosphor configured to convert LED light into yellow phosphor light. Further, the luminescent material may comprise a red phosphor configured to convert LED light and/or yellow phosphor light into red phosphor light. In other words, the LED light may be into a yellow phosphor light and optionally a red phosphor light in the second layer 10. The light which escapes the LED filament from the second elongated translucent layer 10 may be warm white having a color temperature of less than 2500K. In other words, the luminescent material in the second elongated translucent layer 10 may be selected to provide LED filament light from the second elongated translucent layer 10 having a color temperature of less than 2500K. By using a blue LED in combination with the types of phosphor mentioned above the LED filament will provide a flamelike appearance when the LED filament is in use. The LED filament light from the blue LED appears next to the carrier by escaping at the sides of the first layer to resemble the lower part of a flame typically having a blue color and the converted light from the second layer being red and/or yellow will resemble the top part of a flame typically being red and/or yellow.

The first layer 9 may comprise scattering particles 11 arranged to scatter the LED light. This facilitate the LED light to scatter at least partly sideways, transverse to the normal of the major surface 7a. The scattering particles 11 may typically be at least one of BaSO4, Al2O3 and TiO2 particles. The first layer 9 may be 1-10 mm thick, preferably 2-8 mm thick, most preferably 3-6 mm in order to improve the visual effect and have enough LED filament light to scatter in the first layer 9 and thus escaping at the sides of the first layer 9. The first layer 9 may have a light scattering back reflection in the range of 3%-30%, i.e. the first layer 9 may scatter 3%-30% of the LED light back towards the carrier 7. A partially reflective layer may be arranged between the first elongated translucent layer 9 and the second elongated translucent layer 10, increasing the amount of LED light escaping the first layer by the LED light being partially reflected back into the first layer. The first major surface 7a may be reflective, such that for example the light being scattered back towards the carrier 7 in the first layer 9 may be reflected from the first major surface 7a and thus increasing light efficiency of the LED filament 2. Preferably the first major surface is diffuse reflective.

The plurality of LEDs 8 may be configured to emit a first color (e.g. blue light and/or cool white), hence the plurality of LEDs 8 may be blue LEDs and/or cool white LEDs emitting cool white light having a color temperature of at least 6000K. Optionally, all LEDs arranged on the first major surface are blue LEDs and/or cool white LEDs emitting cool white light having a color temperature of at least 6000K. Alternatively, an additional set of LEDs 8' configured to emit a second color, different from the first color, may be arranged on the first major surface 7a. The second color may be red light and/or warm white. Hence, the additional set of LEDs 8' may be red LEDs and/or warm white LEDs. The additional set of LEDs 8' may be intermixed with the plurality of LEDs according to a predetermined pattern. For example, every tenth to every twentieth LED of all the LEDs arranged on the major surface 7a may be a LED of the additional set of LEDs 8'. Alternatively, the additional set of LEDs 8' may be stochastically intermixed with the plurality of LEDs 8 such that about 5%-10% of all the LEDs arranged on the first major surface 7a is a LED of the additional set of LEDs. In this way the color temperature of the LED filament light may be set according to a predetermined color temperature at manufacturing. Each color type LED, i.e. the plurality of LED 8 and the additional set of LEDs 8', may be addressed separately, and their respective intensity may be varied by the controller 5 (see FIG. 1). The controller 5 may in turn be controlled by a remote controller (not shown) via an antenna 6 such that each color type LED may be controlled by the remote controller. By controlling the light intensity of each color type LED the color temperature of the LED filament light may further be dynamically adjustable when the LED filament 2 is in use.

The carrier 7 and the first and second layers may be flexible to provide a bendable (formable) LED filament 2. In this way a desired shape of the LED filament 2 may be achieved.

Now turning to FIG. 2b, illustrating a sideview of the LED filament seen from a direction parallel with the lengthwise direction. Here the width, $W_1$, of the first layer 9 is illustrated being transverse to the lengthwise direction. The first elongated translucent layer 9 is here illustrated has having a first thickness, FT, and the second elongated translucent layer has a second thickness, ST, wherein ST/FT>1.2. For example, the ratio ST/FT may be in the range 1.5-5 such that a configuration is provided where a flamelike effect is best achieved. The LED filament may comprise a height, H, defined by the thickness of the carrier (i.e. the carrier thickness, CT) and the thickness of the first and second layers and wherein the ratio $H/W_1$ is at least 1.5. Preferably, $H/W_1$ is at least 2, more preferably $H/W_1$ is at least 2.5 most preferably $H/W_1$ is at least 3. With increasing ratio of $H/W_1$, an increased amount of LED filament light may escape at the sides of the first layer 9 which is not covered by the second elongated translucent layer 10. The width, $W_1$, of the first layer 9 may be equal to or less than a width of the LED filament 2 extending in the same direction as the width, $W_1$, of the first layer 9. The LEDs 8, 8' arranged on the first major surface 7a may each have a width along the same direction as the width, $W_1$, of the first layer 9. The width of each LED 8, 8' arranged on the carrier 7 may preferably be less than ⅓ of the width, $W_1$, of the first layer 9. In other words, each LED 8, 8' in the plurality of LEDs may have a width which may be at most ⅓ of the width, $W_1$ of the first layer in order to provide an improved light conversion.

Now turning to FIG. 3a, illustrating a LED filament 20 according to at least one embodiment. The LED filament 20 is identical to the LED filament discussed with reference to FIG. 2a, except that the second elongated translucent layer comprises at least two sublayers 21,22. Each sublayer of the at least two sublayers 21,22 may comprise different luminescent materials, such as different phosphor types. Here, the at least two sublayers 21, 22 are illustrated as a first sublayer 21 and a second sublayer 22. However, it should be understood the second elongated translucent layer may comprise more than two sublayers layers, such as a plurality of sublayers. Here the first sublayer 21 is arranged on the outer surface 9a of the first elongated translucent layer 9 and the second sublayer 22 is arranged on an outer surface 21a of the first sublayer 21. It should further be understood that each sublayer in the at least two sublayers 21,22 are stacked such that each sublayer are contained within the width of the layer on which each respective sublayer is arranged, such that each sublayer are be visible when viewed from a side transverse to the lengthwise direction. Consequently, the second sublayer 22 in FIG. 3b is also contained within the width, $W_1$, of the first elongated translucent layer. Hence, each layer in the at least two sublayers will not cover sides of the other sublayers of the at least two sublayers 21,22 transverse to the outer surface 9a and/or the outer surface 21a. In this way light converted in each respective layer may escape the LED filament 2 sideways and thus creating a color gradient comprising colors depending on the material in each sublayer of the plurality of sublayers 21,22. In other words, this provides the light emitted from each layer in the plurality of layers 21,22 to be visible at least when the LED filament 20 is seen from the side. The first sublayer 21 is partly translucent for the LED light such that the LED light is at least partly transmitted through the first sublayer 21 reaching the second sublayer 22. The first sublayer 21 may comprise a first luminescent material, such as a first phosphor type and the second sublayer 22 may comprise a second luminescent material, such as a second phosphor type. Hence, the different luminescent materials in the at least two sublayers 21,22 may provide converted light in different wavelength ranges from each sublayer, i.e. light having different color temperatures. The first luminescent material may be configured to partly convert said LED light into converted light and the second luminescent material may be configured to partly convert said LED light and/or said converted light into further converted light, wherein the further converted light is different from the converted light. The further converted light may preferably have a higher wavelength than the converted light. For example, the first luminescent material may comprise a yellow phosphor and the second luminescent material may comprise a red phosphor, such that the first sublayer emits a yellow phosphor light and the second layer emits a red phosphor light. This may facilitate achieving the flamelike appearance when the LED filament 2 is in use.

FIG. 3b, illustrates the LED filament 20 seen in FIG. 3a, but seen from a side orthogonal to the view in FIG. 3a. Same reasoning applies to FIG. 3b as was discussed with reference to FIG. 2b, except that the LED filament 20 in FIG. 3b comprises the at least two sublayers 21,22. It should further be understood that the height of the second layer in FIG. 3b is defined by the total height (or thickness) of the at least two sublayers 21,22 forming the second layer.

The person skilled in the art realizes that the present invention by no means is limited to the preferred embodiments described above. On the contrary, many modifications and variations are possible within the scope of the appended claims. For example, it may be that more than on core portion of LED filaments are surrounded by the same light guiding structure. Additionally, it may be that each of the core portions of LED filaments have a certain colored LED, therefore emit different colors compared to one another.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A light emitting diode, LED, filament configured to provide LED filament light and comprising:
   an elongated carrier extending in a lengthwise direction of said LED filament, said elongated carrier comprising a first major surface;
   a plurality of LEDs arranged on said first major surface of said elongated carrier, and configured to emit LED light;
   a first elongated translucent layer encapsulating or covering said plurality of LEDs and at least partly encapsulating or covering said first major surface of said elongated carrier, said first elongated translucent layer is substantially free from a luminescent material and comprises light scattering particles, said first elongated translucent layer having a width, W1, transverse to said lengthwise direction;
   a second elongated translucent layer comprising a first luminescent material configured to partly convert said LED light into converted light, the second elongated translucent layer is arranged on an outer surface of said first elongated translucent layer, such that the second elongated translucent layer is contained within the width, $W_1$, of the first elongated translucent layer; and
   wherein LED light is allowed to escape the LED filament from the sides of the first elongated translucent layer which is not covered by the second elongated translucent layer and wherein the LED filament light comprises part of the LED light and the converted light, wherein the carrier and the first and second elongated translucent layers are flexible, and
   wherein 5-40% of the LED light escapes the LED filament at the first elongated translucent layer.

2. The LED filament according to claim 1, wherein the plurality of LEDs comprises blue LEDs emitting blue LED light and/or cool white LEDs emitting cool white light having a color temperature of at least 6000K.

3. The LED filament according to claim 1, wherein the first elongated translucent layer has a thickness of 2-10 mm.

4. The LED filament according to claim 1, wherein the luminescent material in the second elongated translucent layer comprises a yellow phosphor converting LED light into yellow phosphor light, and optionally a red phosphor converting LED light and/or yellow phosphor light into red phosphor light.

5. The LED filament according to claim 1, wherein the second elongated translucent layer comprises at least two sublayers, a first sublayer comprising the first luminescent material configured to partly convert said LED light into converted light and a second sublayer comprising a second luminescent material configured to partly convert said LED light and/or said converted light into further converted light, the second sublayer is arranged on an outer surface of said first sublayer, wherein the further converted light is different from the converted light.

6. The LED filament according to claim 1, wherein said LED filament has a height, H, defined by a carrier thickness and the thickness of the first and second elongated translucent layers and wherein the ratio $H/W_1$ is at least 1.5.

7. The LED filament according to claim 1, wherein the first elongated translucent layer has a first thickness, FT, and the second elongated translucent layer has a second thickness, ST, wherein ST>1.2 FT.

8. The LED filament according to claim 1, wherein a partially reflective layer is arranged between the first elongated translucent layer and the second elongated translucent layer.

9. The LED filament according to claim 1, wherein the light which escapes the LED filament from sides of the first elongated translucent layer which are not covered by the second elongated translucent layer is blue light, blueish light or cool white having a color temperature of at least 4000K.

10. The LED filament according to claim 1, wherein the light which escapes the LED filament from the second elongated translucent layer is warm white having a color temperature of less than 2500K.

11. A lamp comprising a LED filament according to claim 1 and comprising a translucent envelope enveloping said LED filament and a connector for mechanically and electrically connecting the lamp to a socket.

12. The lamp according to claim 11, wherein said lamp comprises a controller for controlling the plurality of LEDs to vary the luminous flux of the LED filament light.

* * * * *